US008222154B2

(12) United States Patent
Doris et al.

(10) Patent No.: US 8,222,154 B2
(45) Date of Patent: Jul. 17, 2012

(54) FIN AND FINFET FORMATION BY ANGLED ION IMPLANTATION

(75) Inventors: Bruce B. Doris, Brewster, NY (US); Kangguo Cheng, Guilderland, NY (US); Geng Wang, Stormville, NY (US)

(73) Assignee: International Business Machines Corporation, Armonk, NY (US)

( * ) Notice: Subject to any disclaimer, the term of this patent is extended or adjusted under 35 U.S.C. 154(b) by 603 days.

(21) Appl. No.: 12/368,561

(22) Filed: Feb. 10, 2009

(65) Prior Publication Data

US 2010/0203732 A1    Aug. 12, 2010

(51) Int. Cl.
*H01L 21/302* (2006.01)

(52) U.S. Cl. ........ 438/705; 438/706; 438/719; 438/525; 438/514; 438/942; 438/947; 216/41; 216/62; 216/87

(58) Field of Classification Search .................. None
See application file for complete search history.

(56) References Cited

U.S. PATENT DOCUMENTS

| 6,900,139 | B1 * | 5/2005 | Dakshina-Murthy et al. ............... 438/725 |
| 2001/0004553 | A1 * | 6/2001 | Mercaldi et al. ............ 438/745 |
| 2002/0001960 | A1 * | 1/2002 | Wu et al. ..................... 438/705 |
| 2003/0123279 | A1 * | 7/2003 | Aipperspach et al. ........ 365/154 |
| 2004/0002203 | A1 | 1/2004 | Deshpande et al. |
| 2006/0276043 | A1 | 12/2006 | Johnson et al. |
| 2007/0001219 | A1 | 1/2007 | Radosavljevic et al. |
| 2007/0049052 | A1 * | 3/2007 | Baier ............................ 438/780 |
| 2008/0057445 | A1 | 3/2008 | Brueck et al. |
| 2008/0286954 | A1 | 11/2008 | Kim et al. |
| 2008/0296737 | A1 * | 12/2008 | Weis et al. ................... 257/623 |

FOREIGN PATENT DOCUMENTS

DE    103 37 808 B3    10/2004

OTHER PUBLICATIONS

Owa et.al., J. Microlith., Microfab., Microsyst., vol. 3, 2004, pp. 97-103.*
H. Shang et al., 2006 Symposium on VLSI Technology Digest of Technical Papers, IEEE, 2006, paper No. 1-4244-0005-8.*
S.E. Steen, Proceedings of SPIE, vol. 5751, 2005, pp. 26-34.*
Search Report and Written Opinion.

* cited by examiner

*Primary Examiner* — Lan Vinh
*Assistant Examiner* — Jiong-Ping Lu
(74) *Attorney, Agent, or Firm* — Scully, Scott, Murphy & Presser, P.C.; H. Daniel Schnurmann (57) ABSTRACT

A semiconductor device is formed by providing a substrate and forming a semiconductor-containing layer atop the substrate. A mask having a plurality of openings is then formed atop the semiconductor-containing layer, wherein adjacent openings of the plurality of openings of the mask are separated by a minimum feature dimension. Thereafter, an angled ion implantation is performed to introduce dopants to a first portion of the semiconductor-containing layer, wherein a remaining portion that is substantially free of dopants is present beneath the mask. The first portion of the semiconductor-containing layer containing the dopants is removed selective to the remaining portion of semiconductor-containing layer that is substantially free of the dopants to provide a pattern of sublithographic dimension, and the pattern is transferred into the substrate to provide a fin structure of sublithographic dimension.

24 Claims, 5 Drawing Sheets

FIN AND FINFET FORMATION BY ANGLED ION IMPLANTATION

FIELD OF THE INVENTION

The present invention relates to microelectronics. More particularly, the present invention relates to a method of forming a finFET device.

BACKGROUND OF THE INVENTION

The dimensions of semiconductor field effect transistors (FETs) have been steadily shrinking over the last thirty years or so, as scaling to smaller dimensions leads to continuing device performance improvements. Planar FET devices typically have a conducting gate electrode positioned above a semiconducting channel, and electrically isolated from the channel by a thin layer of gate oxide. Current through the channel is controlled by applying voltage to the conducting gate.

For a given device length, the amount of current drive for a FET is defined by the device width (w). Current drive scales proportionally to device width, with wider devices carrying more current than narrower devices. Different parts of integrated circuits (ICs) require the FETs to drive different amounts of current, i.e., with different device widths, which is particularly easy to accommodate in planar FET devices by merely changing the device gate width (via lithography).

With conventional planar FET scaling reaching fundamental limits, the semiconductor industry is looking at more unconventional geometries that will facilitate continued device performance improvements. One such class of devices is a finFET.

SUMMARY

A method of forming a plurality of finFET devices is provided, in which each finFET may have a width of sublithographic dimension. Broadly, the method includes forming a mask having a plurality of openings atop a semiconductor-containing layer which is located on a substrate. An angled ion implantation is then performed to introduce dopants to a first portion of the semiconductor-containing layer, wherein a remaining portion that is substantially free of dopants is present beneath the mask. The first portion of the semiconductor-containing layer containing the dopants is thereafter removed selective to the remaining portion of semiconductor-containing layer that is substantially free of the dopants to provide a pattern. The pattern is then transferred into the substrate to provide a fin structure having a width of sublithographic dimension.

In another embodiment, a method of manufacturing a semiconductor device, such as a finFET, is provided, which includes first forming a mask having a plurality of openings atop a semiconductor-containing layer which is located on a substrate. Adjacent openings of the plurality of openings of the mask are separated by a dimension ranging from 30 nm to 200 nm. An angled ion implantation is then performed to introduce dopants to a first portion of the semiconductor-containing layer in a concentration ranging from $1 \times 10^{18}$ atoms/cm$^3$ to $8 \times 10^{21}$ atoms/cm$^3$, wherein a remaining portion of the semiconductor-containing layer beneath the mask is substantially free of dopants. The first portion of the semiconductor-containing layer is etched selective to the remaining portion of semiconductor-containing layer to provide an etch mask having openings with a width ranging from 5 nm to 100 nm. The pattern provided by the etch mask is then transferred into the underlying substrate to provide a fin structure having a width ranging from 5 nm to 100 nm.

In another aspect, an etch mask is provided that may be utilized to produce a plurality of fin structures, wherein each fin structure produced by the etch mask has a width that is of sublithographic dimension, and a distance of sublithographic dimension separates the adjacent finFET structures. Broadly, the etch mask includes a semiconductor-containing layer that is comprised of doped semiconductor regions separated by un-doped semiconductor spacers, wherein a width of each of the doped semiconductor regions and a width of the un-doped semiconductor spacers is of sublithographic dimension.

DETAILED DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which.

DETAILED DESCRIPTION OF THE INVENTION

Detailed embodiments of the present invention are disclosed herein; however, it is to be understood that the disclosed embodiments are merely illustrative of the invention that may be embodied in various forms. In addition, each of the examples given in connection with the various embodiments of the invention is intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

The present invention relates to structures and methods for forming a semiconductor device, such as a finFET semiconductor device. When describing the following structures and methods, the following terms have the following meanings, unless otherwise indicated.

As used herein, "semiconductor" refers to an intrinsic semiconductor material that has been doped, that is, into which a dopant has been introduced, giving it different electrical properties than the intrinsic semiconductor. Doping involves adding dopant atoms to an intrinsic semiconductor, which changes the electron and hole carrier concentration of the intrinsic semiconductor at thermal equilibrium. Since dominant carrier concentrations in an extrinsic semiconductor classify it as either an n-type or p-type semiconductor.

As used herein, a "fin structure" refers to a semiconductor material, which is employed as the body of a field effect transistor, in which the gate dielectric and gate are positioned around the fin structure such that charge flows down the channel on the two sides of the fin structure and optionally along the top surface of the fin structure.

The "width" as used to describe the fin structure is the dimension that separates the channel that is present on the opposing sides of the fin structure.

As used herein, an "anisotropic etch process" denotes a material removal process in which the etch rate in the direction normal to the surface to be etched is greater than in the direction parallel to the surface to be etched.

The term "isotropic etch process" means a material removal process in which the rate of the etching reaction is the same in any direction.

The term "minimum feature dimension" means substantially the smallest dimension obtainable by lithography.

The term "sublithographic dimension" means less than the smallest dimension obtainable by lithography.

As used herein, the terms "dielectric", "insulating" or "insulating properties" denotes a material having a room temperature conductivity of less than about $10^{-10}$ $(\Omega\text{-m})^{-1}$.

As used herein, the term "selective" in reference to a material removal process denotes that the rate of material removal for a first material is greater than the rate of removal for at least another material of the structure to which the material removal process is being applied.

As used herein, the term "non-selective" in reference to a material removal process denotes that the rate of material removal for a first material is substantially the same as the other materials of the structure to which the material removal process is being applied.

For purposes of the description hereinafter, the terms "upper", "lower", "right", "left", "vertical", "horizontal", "top", "bottom", and derivatives thereof shall relate to the invention, as it is oriented in the drawing figures.

Further, it will be understood that when an element as a layer, region or substrate is referred to as being "on" or "atop" or "over" or "overlying" or "below" or "beneath" or "underlying" another element, it can be directly on the other element or intervening elements may also be present. In contrast, when an element is referred to as being "directly on" or "directly over" of in "direct physical contact" with another element, there are no intervening elements present.

References in the specification to "one embodiment", "an embodiment", "an example", etc., indicate that the embodiment or example described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments and examples whether or not explicitly described.

FIGS. 1-8 depict one embodiment of a process sequence for forming a plurality of finFET devices, in which each finFET device has a fin structure having a width W1 of sublithographic dimension. The method of this embodiment of the invention, which is illustrated in FIGS. 1-8 includes first forming a semiconductor-containing layer atop a substrate. A mask having a plurality of openings is then formed on a surface of the semiconductor-containing layer, wherein the openings of the mask have a width equal to a minimum feature dimension F. Thereafter, the method further includes introducing dopants via an angled ion implantation into a first portion of the semiconductor-containing layer, wherein a remaining portion of the semiconductor-containing layer that is substantially free of dopants is present beneath the mask In a following step, the first portion of the semiconductor-containing layer is removed selective to the remaining portion of semiconductor-containing layer, and the pattern is transferred into the substrate to provide a fin structure having a width W1 of sublithographic dimension.

Figure 1:
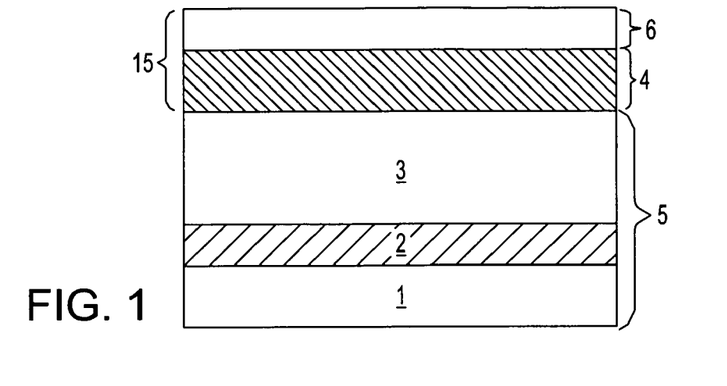
FIG. 1 is a side cross-sectional view of an initial structure as used in a method for forming a finFET device, wherein the initial structure includes a semiconductor on insulator (SOI) substrate having a dielectric layer present on the upper surface of the SOI substrate and a semiconductor-containing layer atop the dielectric layer, in accordance with one embodiment of the present invention.

FIG. 1 depicts an initial structure used in one embodiment of a method for forming a finFET device, in accordance with the present invention. The initial structure may include a substrate 5, and a stack 15 of a semiconductor-containing layer 6 and a dielectric layer 4.

In one embodiment, the substrate 5 includes an SOI substrate. An SOI substrate includes a bottom semiconductor layer 1 and a top semiconductor layer 3 (which is interchangeably referred to as an SOI layer 3) that are electrically isolated from each other by a buried insulating layer 2. The top semiconductor layer 3 and the bottom semiconductor layer 1 may comprise at least one of Si, Ge alloys, SiGe, GaAs, InAs, InP, SiCGe, SiC as well as other III/V or II/VI compound semiconductors. The top semiconductor layer 3 and bottom semiconductor layer 1 may comprise the same or different materials. In one example, the entire top semiconductor layer 3, or a portion of the top semiconductor layer 3, may be amorphous, polycrystalline, or monocrystalline. In one example, the entire bottom semiconductor layer 1, or a portion of the bottom semiconductor layer 1, may be amorphous, polycrystalline, or monocrystalline.

In addition to the aforementioned types of semiconductor substrates, the semiconductor substrate employed in the present invention may also comprise a hybrid orientation semiconductor substrate in which the top semiconductor layer 3 and the bottom semiconductor layer 1 have surface regions of different crystallographic orientations. The top semiconductor layer 3 and the bottom semiconductor layer 1 may be doped, undoped or contain doped regions and undoped regions therein. Further, the top semiconductor layer 3 and the bottom semiconductor layer 1 may contain regions with strain and regions without strain therein. In one example, the top semiconductor layer 3 and the bottom semiconductor layer 1 may contain regions of tensile strain and compressive strain.

The buried insulating material 2 separating the top semiconductor layer 3 and the bottom semiconductor layer 1 may be a crystalline or non-crystalline oxide, nitride, oxynitride, or any other suitable insulating material. The SOI substrate 5 employed in the present invention may be formed utilizing a layer transfer process including a bonding step. Alternatively, an implantation process such as SIMOX (Separation by IMplantation of OXygen) can be used in forming the SOI substrate 5

The thickness of the various layers of the substrate 5 may vary depending on the technique used in forming the same. In one embodiment, the top semiconductor layer 3 has a thickness from 3 nm to 100 nm, the buried insulating layer 2 has a thickness from 10 nm to 150 nm, and the thickness of the bottom semiconductor layer 1 of the SOI substrate 5 is inconsequential to the present invention.

It is noted that although an SOI substrate is depicted and described in the following discussion, embodiments of the present invention are contemplated that utilize a bulk semiconductor substrate. In one example of the present invention, in which a bulk semiconductor substrate is used, the bulk semiconductor substrate comprises at least one of Si, Ge alloys, SiGe, GaAs, InAs, InP, SiCGe, SiC as well as other III/V or II/VI compound semiconductors.

Still referring to FIG. 1, a layered stack 15 composed of a semiconductor-containing layer 6 and a dielectric layer 4 is present atop the substrate 5. The dielectric layer 4 may be positioned on the upper surface of the top semiconductor layer 3 of the substrate 5. The semiconductor-containing layer 6 is positioned on the upper surface of the dielectric layer 4.

The dielectric layer 4 may be composed of a nitride, oxide, oxynitride material, and/or any other suitable dielectric layer. The dielectric layer 4 may comprise a single layer of dielectric material or multiple layers of dielectric materials. The dielectric layer 4 can be formed by a deposition process, such as chemical vapor deposition (CVD) and/or atomic layer deposition (ALD). Chemical vapor deposition (CVD) is a deposition process in which a deposited species is formed as a result of chemical reaction between gaseous reactants at greater than room temperature (25° C. to 900° C.); wherein solid product of the reaction is deposited on the surface on which a film, coating, or layer of the solid product is to be formed. Variations of CVD processes include, but not limited to, Atmospheric Pressure CVD (APCVD), Low Pressure CVD (LPCVD) and Plasma Enhanced CVD (EPCVD), Metal-Organic CVD (MOCVD) and combinations thereof may also be employed. Alternatively, the dielectric layer 4 may be formed using a growth process, such as thermal oxidation or thermal nitridation. The dielectric layer 4 may have a thickness ranging from 1 nm to 100 nm. In one embodiment, the dielectric layer 4 is composed of an oxide, such as $SiO_2$, that is formed by chemical vapor deposition to a thickness on the order of 25 nm to 50 nm.

The semiconductor-containing layer 6 may be a silicon-containing material. Si-containing materials include, but are not limited to: silicon, single crystal silicon, polycrystalline silicon, silicon germanium, silicon carbon alloy, silicon-on-silicon germanium, amorphous silicon, silicon-on-insulator (SOI), silicon germanium-on-insulator (SGOI), and annealed polysilicon. In one embodiment, the semiconductor-containing layer 6 is composed of amorphous Si or polycrystalline Si. As used herein, the term "amorphous" denotes a non-crystalline solid having no periodicity and long-range order. The term "crystalline" means a solid arranged in fixed geometric patterns or lattices. Polycrystalline Si is a material composed of multiple Si crystals. The semiconductor layer may be formed using a deposition method, such as chemical vapor deposition. The thickness of the semiconductor-containing layer 6 deposited at this point of the present invention may vary, but typically the deposited semiconductor-containing layer 6 has a thickness of from 5 nm to 100 nm. In another embodiment, the semiconductor-containing layer 6 has a thickness ranging from 10 nm to 50 nm.

Referring to FIGS. 2-6, in a following process sequence, the semiconductor-containing layer 6 may be doped with an appropriate dopant for etch selectivity in providing an etch mask 100 having openings 8 of sublithographic dimension. The dopant may be introduced by an angled implant 9 in combination with a mask 7 having openings 8 of the minimum feature dimension. Thereafter, the doped portions 11 of the semiconductor-containing layer 6 are etched selective to the remaining undoped portions 12 to provide openings 13 in the semiconductor-containing layer 6 that are of sublithographic dimension, hence providing the etch mask 100. In a following process step, the pattern produced by the etch mask 100 is then transferred into the SOI layer 3 of the substrate 5 to provide a fin structure 10 having a width of sublithographic dimension.

Figure 2:
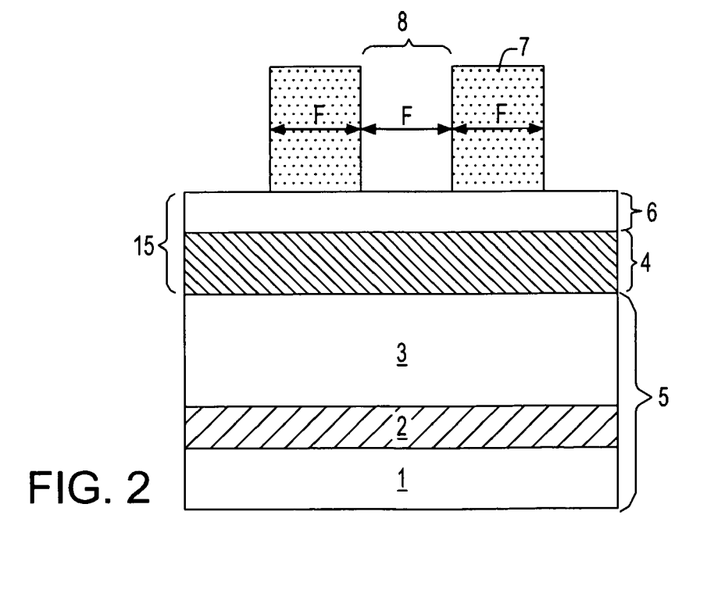
FIG. 2 is a side cross-sectional view depicting forming a mask having a plurality of openings overlying the semiconductor-containing layer that is present on the substrate, wherein adjacent openings of the plurality of openings of the mask are separated by a minimum feature dimension, in accordance with one embodiment of the present invention.

FIG. 2 depicts forming a mask 7 having openings 8 of the minimum feature dimension F. In one example, to provide the mask 7 a photoresist layer is first positioned atop the semiconductor-containing layer 6. The photoresist layer may be provided by a blanket layer of photoresist material that is deposited on the surface of the semiconductor-containing layer 6 utilizing a deposition process such as, for example, CVD, PECVD, evaporation or spin-on coating. The blanket layer of photoresist material is then patterned to provide the mask 7 utilizing a lithographic process that may include exposing the photoresist material to a pattern of radiation and developing the exposed photoresist material utilizing a resist developer. It is noted that a hardmask, e.g., oxide or nitride hardmask, may also be utilized to provide the mask 7.

The openings 8 of minimum feature dimension may have a width F ranging from 20 nm to 1000 nm. In another embodiment, the openings 8 of minimum feature dimension have a width F ranging from 40 nm to 300 nm. Preferably, the openings 8 of minimum feature dimension have a width F ranging from 40 nm to 100 nm. In one embodiment, the width of the openings 8 is equal to the width F of the portion of the mask 7 positioned between the openings 8.

Figure 3:
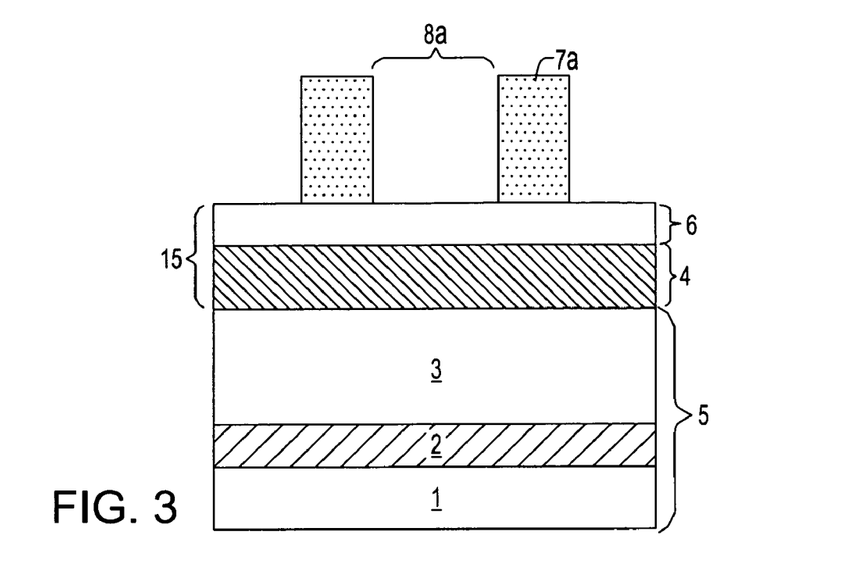
FIG. 3 is a side cross-sectional view depicting mask trimming, in accordance with one embodiment of the present invention.

FIG. 3 depicts one embodiment of trimming the mask to provide openings 8a having a width greater than the minimum feature dimension, wherein the remaining portion 7a of the mask between the openings 8a has a width that is less than the minimum feature dimension. In one example, in which the mask is composed of a photoresist material, trimming of the mask may include a plasma etch with an $O_2$/HBr/Ar plasma chemistry. Following trimming, the remaining portion 7a of the mask between the openings 8a may have a width ranging from 25 nm to 1000 nm. In one embodiment, following trimming, the remaining portion 7a of the mask between the openings 8a may have a width ranging from 40 nm to 200 nm. Preferably, the remaining portion 7a of the mask between the openings 8a may have a width ranging from 40 nm to 100 nm. It is noted that the step of mask trimming is optional.

Figure 4:
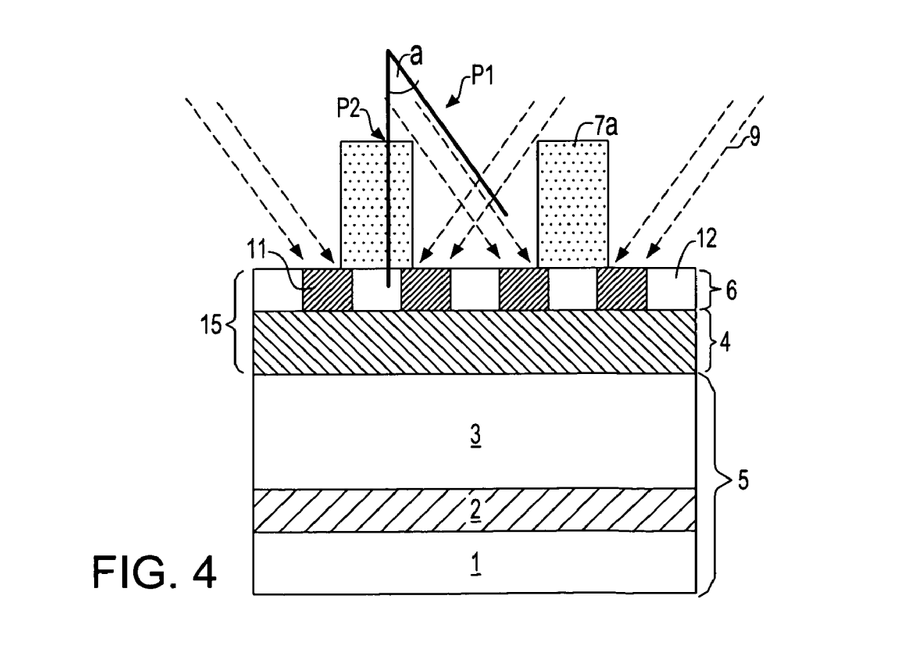
FIG. 4 is a side cross-sectional view depicting performing an angled ion implantation to introduce dopants to a first portion of the semiconductor-containing layer, wherein a remaining portion that is substantially free of dopants is present beneath the mask, in accordance with one embodiment of the present invention.

FIG. 4 depicts performing an angled ion implantation 9 to introduce dopants to a first portion 11 of the semiconductor-containing layer 6, wherein a remaining portion 12 of the semiconductor-containing layer 6 is substantially free of dopants. In one embodiment, the remaining portion 12 of the semiconductor-containing layer 6 is present beneath the remaining portion 7a of the mask.

In one embodiment, the dopants are composed of arsenic, phosphorus, germanium, xenon, argon, krypton, or a combination thereof. It is noted that other dopants are also contemplated and are within the scope of the invention, so long as the dopants allow for selective etching between the first portion 11 of the semiconductor-containing layer 6 in which the dopants are present and the remaining portion 12 of the semiconductor-containing layer 6 that is substantially free of the dopants.

Angled ion implantation 9 as used throughout the instant application denotes that dopants are implanted towards the surface of the semiconductor-containing layer 6 along a plane P1 that forms an acute angle α when intersecting with the plane P2 that is substantially perpendicular to the surface of the semiconductor-containing layer 6. The angled ion implantation 9 may include an angle α ranging from 3° to 75°. In another embodiment, the angled ion implantation 9 includes an angle α ranging from 5° to 60°. Preferably, the angled ion implantation 9 includes an angle α ranging from 15° to 45°.

The dopant concentration in the first portion 11 of the semiconductor-containing layer 6 may range from $1\times10^{18}$ atoms/cm$^3$ to $8\times10^{21}$ atoms/cm$^3$. In another embodiment, the dopant concentration in the first portion 11 of the semiconductor-containing layer 6 ranges from $1\times10^{19}$ atoms/cm$^3$ to $3\times10^{20}$ atoms/cm$^3$. Preferably, the dopant concentration in the first portion 11 of the semiconductor-containing layer 6 ranges from $3\times10^{19}$ atoms/cm$^3$ to $1\times10^{20}$ atoms/cm$^3$.

The terms "substantially free of the dopants" as used to describe the remaining portion 12 of the semiconductor-containing layer 6 means that the dopant concentration is less than $1\times10^{18}$ atoms/cm$^3$. In one embodiment, the dopant concentration in the remaining portion 12 of the semiconductor layer 6 is less than about $3\times10^{17}$ atoms/cm$^3$. In an even further embodiment, the dopant concentration in the remaining portion 12 of the semiconductor-containing layer 6 is less than about $1\times10^{17}$ atoms/cm$^3$.

The angled implant 9 may include a boron dopant and may employ an implant having an ion dosage ranging from $1\times10^{13}$ atoms/cm$^2$ to $5\times10^{15}$ atoms/cm$^2$. In one embodiment, the angled implant 9 is carried out using an ion implant apparatus that operates at an energy ranging from 5.0 keV to 60.0 keV. In another embodiment, the angled implant 9 is carried out using an energy of from 10.0 keV to 40.0 keV. The angled implant 9 may be carried out at a temperature ranging from 50° C. to 800° C. In another embodiment, the angled implant 9 is carried out with a temperature ranging from 100° C. to 400° C.

In one example, the first portion 11 of semiconductor-containing layer 6 has a dopant concentration ranging from $1\times10^{18}$ atoms/cm$^3$ to $8\times10^{21}$ atoms/cm$^3$ and includes an extension region that is present underlying the remaining portion 7a of the mask by a dimension ranging from 3 nm to 20 nm, as measured from a sidewall of the remaining portion 7a of the mask.

Figure 5:
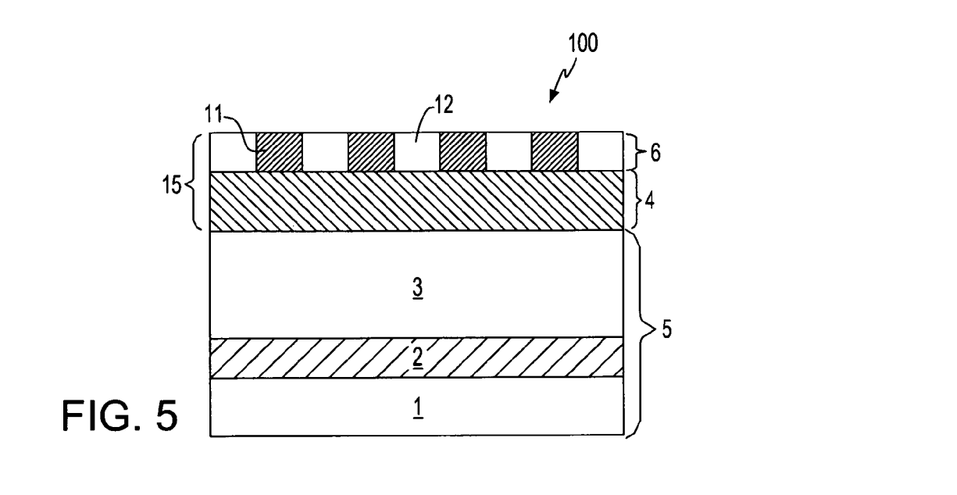
FIG. 5 is a side cross-sectional view depicting an etch mask for producing fin structures having a width of sublithographic dimension, in which the etch mask is composed of a semiconductor-containing layer having a doped first portion and a remaining portion that is substantially free of dopants, in accordance with one embodiment of the present invention.

Referring to FIG. 5, following the angled implant, the remaining portion 7a of the mask is removed. In one embodiment, in which the remaining portion 7a of the mask is composed of photoresist, the remaining portion 7a of the mask may be removed using oxygen ashing. As depicted in FIG. 5, the etch mask 100 includes a periodical doped semiconductor-containing layer 6, wherein the width of both the doped and undoped portions e.g., spacers, 11, 12 respectively, of the semiconductor-containing layer 6 is of a sublithographic dimension.

Figure 6:
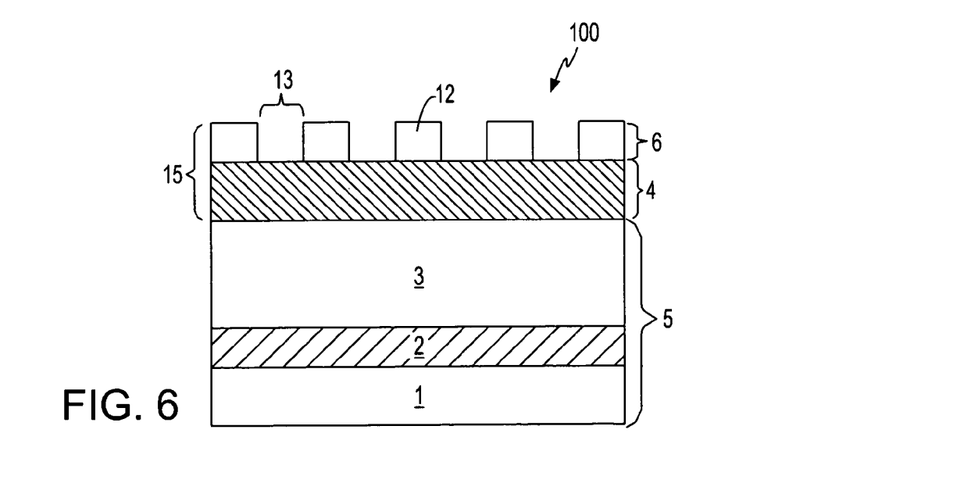
FIG. 6 is a side cross-sectional view depicting removing the first portion of the semiconductor-containing layer containing dopants selective to the remaining portion of semiconductor-containing layer that is substantially free of dopants to provide a pattern for forming the fin structures, in accordance with one embodiment of the present invention.

FIG. 6 depicts removing the first portion 11 of the semiconductor-containing layer 6 containing the dopants selective to the remaining portion 12 of semiconductor-containing layer 6 that is substantially free of the dopants. Removing the first portion 11 of the semiconductor-containing layer 6 provides a pattern that protects portions of the underlying SOI layer 3, wherein each portion of the SOI layer 3 that is protected by the pattern has a width of a sublithographic dimension. The pattern (i.e., each remaining portion 12 of the semiconductor layer 6) may have a width ranging from 10 nm to 200 nm. In one embodiment, the pattern has a width ranging from 12 nm to 100 nm. Preferably, the pattern has a width ranging from 15 nm to 30 nm.

The first portion 11 of the semiconductor-containing layer 6 may be removed by etching. The remaining portion 12 of the semiconductor-containing layer 6 provides an etch mask 100 that is utilized to shape a fin structure 10 from the underlying SOI layer 3 of the substrate 5 during subsequent process steps. In one embodiment, the etching the first portion 11 of the semiconductor-containing layer 6 selective to the remaining portion 12 of semiconductor-containing layer 6 comprises a substantially isotropic etch having an etch selectivity from 500 parts first portion 11 to 1 part remaining portion 12 to 5 parts first portion 11 to 1 part remaining portion 12. In another embodiment, the isotropic etch may be a wet etch that comprises an etchant of ammonium hydroxide (NH$_4$OH), tetramethylammonium hydroxide (TMAH), hydrazine, ethylene diamine pyrocatechol (EDP) or a combination thereof. In a yet further embodiment and when the semiconductor-containing layer 6 comprises amorphous Si, and the first portion 11 of the semiconductor-containing layer 6 is doped with arsenic in a concentration ranging from $4\times10^{19}$ to $1\times10^{20}$ atoms/cm$^3$, the isotropic etch may include a wet etch comprising ammonium hydroxide (NH$_4$OH). Alternatively, the isotropic etch may include a dry etch with etching gas comprising sulfur hexafluoride (SF$_6$), molecular chlorine (Cl$_2$), hydrogen bromide (HBr), or any suitable combination of those gases.

Figure 7:
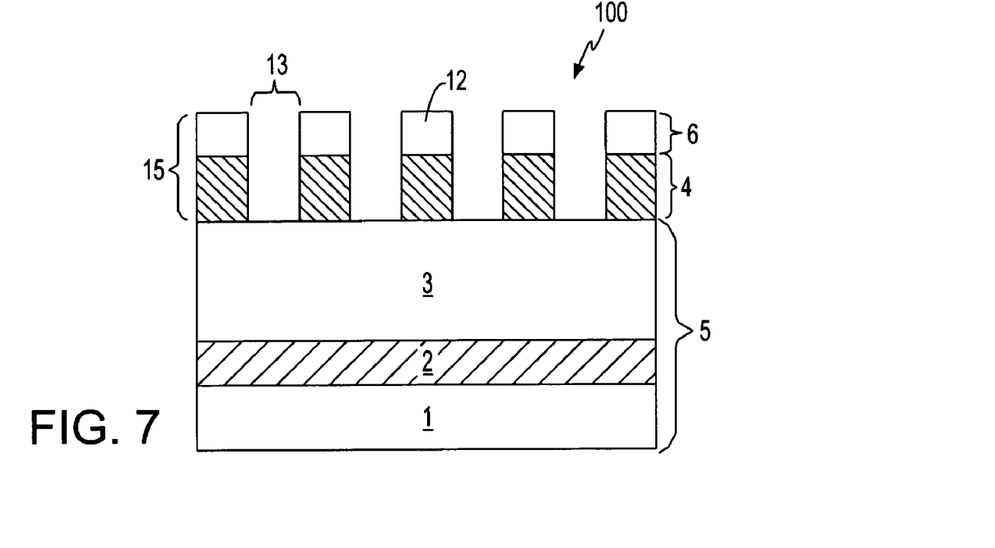
FIG. 7 is a side cross-sectional view depicting transferring the pattern into the dielectric layer that is present on the upper surface of the substrate, in accordance with the present invention.

FIG. 7 depicts transferring the pattern that is produced by the etch mask 100 into the dielectric layer 4 that is present on the upper surface of the substrate 5. The transferring of the pattern provided by the etch mask 100 into the underlying substrate 5 may include an anisotropic etch. More specifically, and in one embodiment, the pattern that is provided by the etch mask 100 may be transferred into the top semiconductor layer 3 of the underlying substrate 5 using a two stage anisotropic etch.

The anisotropic etch may include reactive-ion etching (RIE). Reactive Ion Etching (RIE) is a form of plasma etching in which during etching the surface to be etched is placed on the RF powered electrode, moreover, during RIE the surface to be etched takes on a potential that accelerates the etching species extracted from a plasma toward the surface, in which the chemical etching reaction is taking place in the direction normal to the surface. Other examples of anisotropic etching that can be used at this point of the present invention include ion beam etching, plasma etching or laser ablation.

The two stage anisotropic etch may include a first selective etch that removes the exposed portions of the dielectric layer 4, wherein the etch mask 100 protects the portions of the dielectric layer 4 that are present beneath the remaining portion 12 of the semiconductor-containing layer 6. The SOI layer 3 that is beneath the protected portions of the dielectric layer 4 provides the fin structure 10 of the subsequently formed device. The first stage of the anisotropic etch may continue until the portion of the dielectric layer 4 exposed by the etch mask 100 is removed to expose the SOI layer 3. In one embodiment, in which the etch mask 100 is composed of amorphous Si and the dielectric layer 4 is composed of an oxide, such as $SiO_2$, the etch chemistry of the first stage of the anisotropic etch may be composed of oxygen ($O_2$), hexafluorobutadiene ($C_4F_6$), and argon (Ar).

Figure 8:
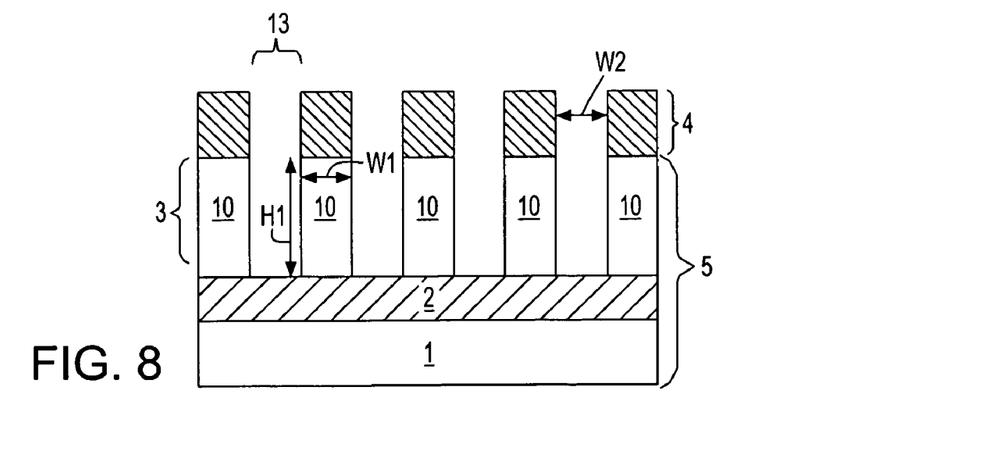
FIG. 8 is a side cross-sectional view depicting transferring the pattern into the SOI layer of the semiconductor on insulator substrate to provide a fin structure having a width that is of sublithographic dimension, in accordance with the present invention.

In a second stage of the anisotropic etch, the exposed portion of the SOI layer 3 is removed by an etch chemistry that removes the material of the SOI layer 3 selective to the buried insulating layer 2. During the second stage of the etch process, the remaining portion of the dielectric layer 4 functions as a hard etch mask that protects the underlying portion of the SOI layer 3 to provide the fin structures 10 from the SOI layer 3. During the second stage of the anisotropic etching, the remaining portion 12 of the semiconductor-containing layer 6 may be removed. In one embodiment, in which the dielectric layer 4 is composed of an oxide, such as $SiO_2$, the etch chemistry of the first state of the anisotropic etch may be composed of oxygen ($O_2$), hexafluorobutadiene ($C_4F_6$), and argon (Ar). In another embodiment, in which the dielectric layer 4 is composed of an oxide, such as $SiO_2$, and the SOI layer 3 is composed of silicon, the etch chemistry of the second stage of the anisotropic etch may be composed of difluoromethane ($CH_2F_2$), tetrafluoromethane ($CF_4$), oxygen ($O_2$), and nitrogen ($N_2$). The second stage of the anisotropic etch may define the fin structures 10, as depicted in FIG. 8.

The fin structure 10 may have a height H1 ranging from 5 nm to 200 nm. In one embodiment, the fin structure 10 has a height H1 ranging from 10 nm to 100 nm. Preferably, the semiconductor fin structure 10 has a height H1 ranging from about 20 nm to about 50 nm.

The fin structure 10 may have a width W1 of sublithographic dimension. In one embodiment, the fin structure 10 has a width W1 ranging from 5 nm to 200 nm. Preferably, the semiconductor fin structure 10 has a width W1 ranging from 15 nm to 30 nm.

The openings 13 between the adjacent fin structures 10 may each have a width W2 ranging from 10 nm to 200 nm. In one embodiment, openings 13 have a width W2 ranging from 15 nm to 100 nm. Preferably, the openings 13 have a width W2 ranging from 15 nm to 30 nm. In one example, the openings 13 may be half the minimum feature dimension.

Figure 9A:
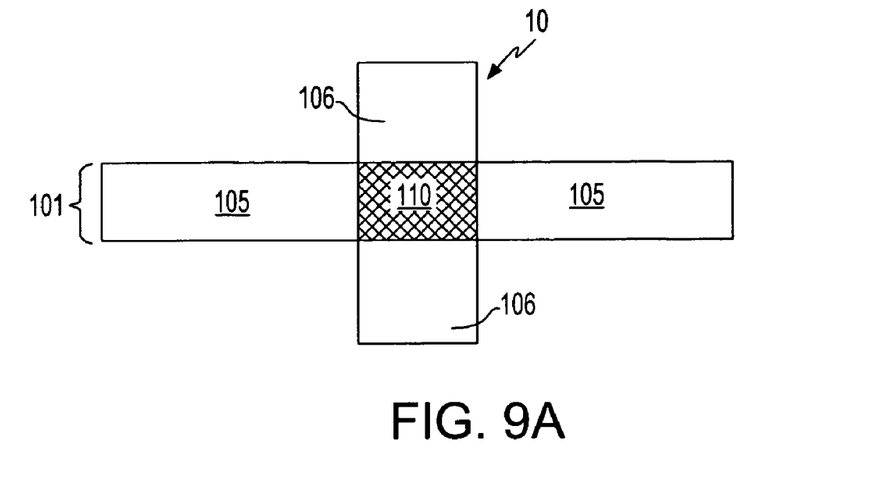
FIG. 9A is a top planar view of one embodiment of a finFET structure, in accordance with the present invention.
Figure 9B:
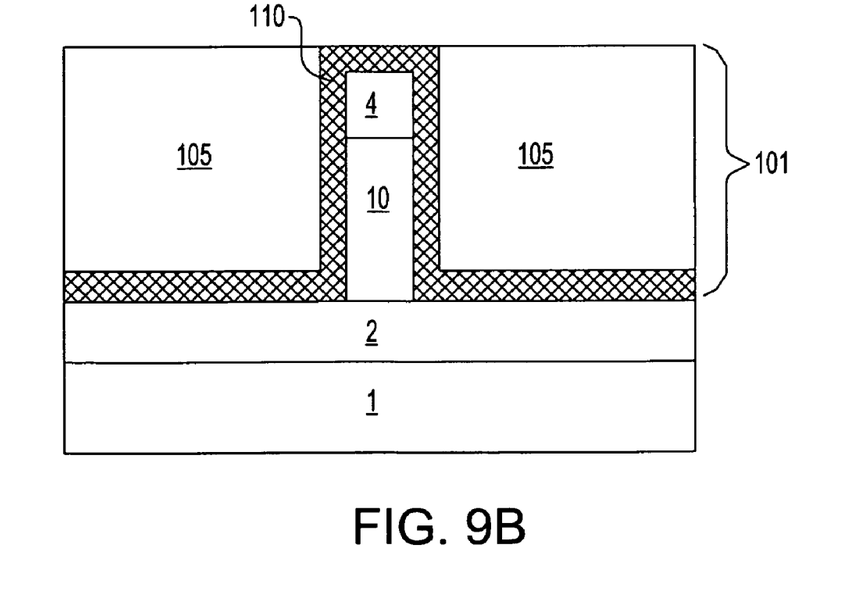
FIG. 9B is a side cross-sectional view of the finFET structure depicted in FIG. 9A.

Following the formation of the fin structure 10, further processing may be conducted to provide a finFET, as depicted in FIGS. 9A and 9B. It is noted that the following process steps for producing a finFET are provided for illustrative purposes and are not intended to limit the invention, as additional and intermediate processing steps that are not discussed herein are contemplated and are within the scope of the invention. In one example, a gate structure 101 may be formed contacting the fin structure 10. The gate structure 101 may include at least one gate conductor 105 and at least one gate dielectric 110, wherein the gate dielectric 110 is positioned between the gate conductor 105 and the fin structure 10. The gate dielectric 110 is typically positioned on at least the vertical sidewalls of the fin structure 10.

The gate dielectric 110 may be formed by a thermal growth process such as, for example, oxidation, nitridation or oxynitridation. The gate dielectric 110 may also be formed by a deposition process such as, for example, chemical vapor deposition (CVD), plasma-assisted CVD, metal organic chemical vapor deposition (MOCVD), atomic layer deposition (ALD), evaporation, reactive sputtering, chemical solution deposition and other like deposition processes. The gate dielectric 110 may also be formed utilizing any combination of the above processes.

The gate dielectric 110 may be comprised of an insulating material having a dielectric constant of about 4.0 or greater. In another embodiment, the gate dielectric 110 is comprised of an insulating material having a dielectric constant greater than 7.0. The dielectric constants mentioned herein are relative to a vacuum. In one embodiment, the gate dielectric 110 employed in the present invention includes, but is not limited to: an oxide, nitride, oxynitride and/or silicates including metal silicates, aluminates, titanates and nitrides. In one example, when the gate dielectric 110 is comprised of an oxide, the oxide may be selected from the group including, but not limited to: $SiO_2$, $HfO_2$, $ZrO_2$, $Al_2O_3$, $TiO_2$, $La_2O_3$, $SrTiO_3$, $LaAlO_3$, $Y_2O_3$ and mixture thereof. The physical thickness of the gate dielectric 110 may vary, but typically, the gate dielectric 110 has a thickness from 1 nm to 10 nm. In another embodiment, the gate dielectric 110 has a thickness from 1 nm to 3 nm.

After forming the gate dielectric 110, a blanket layer of a conductive material which forms the gate conductor 105 of gate structure 101 is formed on the gate dielectric 110 utilizing a known deposition process, such as physical vapor deposition (PVD), CVD or evaporation. The conductive material may comprise polysilicon, SiGe, a silicide, a metal or a metal-silicon-nitride such as Ta—Si—N. Examples of metals that can be used as the conductive material include, but are not limited to: Al, W, Cu, Ti or other like conductive metals. The blanket layer of conductive material may be doped or undoped. If doped, an in-situ doping deposition process may be employed. Alternatively, a doped conductive material can be formed by deposition, ion implantation and annealing.

After deposition of at least the gate dielectric 110 and the conductive material, gate structures 101 including the gate conductor 105 are formed. In one embodiment, the gate structures 101 are formed by first providing a patterned mask atop the conductive material by deposition and lithography and then transferring the pattern to the conductive material and the gate dielectric 110. The etching steps may comprise one or more etching processes including dry etching, such as RIE. The region of fin structure 10 in which the gate conductors 105 cross over is the channel region.

In a following process step, source and drain regions 106 may be provided on opposing sides of the channel. For example, dopants may be implanted via ion implantation into each end of the fin structure 10 to produce n-type conductivity or p-type conductivity dopant regions, i.e., source and drain regions 106. P-type conductivity dopant regions are produced in fin structures 10 by doping a portion of the fin structure 10 with group III-A elements of the periodic table of elements, such as B. N-type conductivity is produced in the fin structures 10 by doping the fin structure 10 with group V elements, such as P or As.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:

forming a mask having a plurality of openings atop a semiconductor-containing layer, said semiconductor-containing layer is located atop a substrate;

performing an angled ion implantation to introduce dopants to first portions of the semiconductor-containing layer, wherein a first region of a remaining portion of the semiconductor-containing layer is beneath the mask and is substantially free of said dopants, and a second region of the remaining portion of the semiconductor-containing layer that is substantially free of said dopants is present within the plurality of openings and is present between adjacent first portions of the semiconductor-containing layer that are doped;

removing the first portion of the semiconductor-containing layer containing the dopants selective to the remaining portion of semiconductor-containing layer that is substantially free of the dopants to provide a pattern;

transferring the pattern into the substrate to provide a fin structure having a width of sublithographic dimension;

forming a gate structure on a first portion of the fin structure; and forming a source region and a drain region within the fin structure on opposing sides of the first portion of the fin structure to form a finFET device.

2. The method of claim 1, wherein adjacent openings of the plurality of openings of the mask are separated by a minimum feature dimension.

3. The method of claim 1, wherein the substrate comprises a top semiconductor layer positioned on a buried insulator layer.

4. The method of claim 1, wherein the semiconductor-containing layer is a silicon-containing layer.

5. The method of claim 4, wherein the semiconductor-containing layer is composed of amorphous Si or polycrystalline Si.

6. The method of claim 1, wherein the angled ion implantation includes an angle ranging from 3° to 75°, wherein the angle is measured at an intersection between a plane parallel to a direction of travel of the dopants and a plane perpendicular to a surface of the substrate.

7. The method of claim 1, wherein the dopants are composed of arsenic, phosphorus, germanium, xenon, argon, krypton, or a combination thereof.

8. The method of claim 1, wherein said first portion has a dopant concentration ranging from $1\times10^{18}$ atoms/cm$^3$ to $8\times10^{21}$ atoms/cm$^3$.

9. The method of claim 1, wherein the remaining portion has a dopant concentration of less than $1\times10^{18}$ atoms/cm$^3$.

10. The method of claim 2, wherein the minimum feature dimension ranges from 30 nm to 200 nm.

11. The method of claim 8, wherein the first portion of semiconductor-containing layer including a dopant concentration ranging from $1\times10^{18}$ atoms/cm$^3$ to $8\times10^{21}$ atoms/cm$^3$ has an extension region that is present beneath the mask by a dimension ranging from 3 nm to 20 nm as measured from a sidewall of the mask.

12. The method of claim 1, wherein the etching the first portion of the semiconductor-containing layer containing the dopants selective to the remaining portion of semiconductor-containing layer that is substantially free of the dopants comprises a substantially isotropic etch having an etch selectivity from 500 parts of the first portion to 1 part of the remaining portion to 5 parts of the first portion to 1 part of the remaining portion.

13. The method of claim 1, wherein the transferring of the pattern provide by the mask into the substrate includes an anisotropic etch.

14. The method of claim 1, further comprising trimming the mask.

15. The method of claim 1, wherein the fin structure has a width ranging from 10 nm to 50 nm.

16. A method of forming a semiconductor device comprising:

forming a mask having a plurality of openings atop a semiconductor-containing layer, said semiconductor-containing layer is located on a substrate and wherein adjacent openings of the plurality of openings of the mask are separated by a dimension ranging from 30 nm to 200 nm;

performing an angled ion implantation to introduce dopants to a first portion of the semiconductor-containing layer in a concentration ranging from $1\times10^{18}$ atoms/cm$^3$ to $8\times10^{21}$ atoms/cm$^3$, wherein a first region of a remaining portion of the semiconductor-containing layer that is beneath the mask and is substantially free of dopants and a second region of the remaining portion of the semiconductor-containing layer that is substantially free of said dopants is present within the plurality of openings and is present between adjacent first portions of the semiconductor-containing layer that are doped;

etching the first portion of the semiconductor-containing layer selective to the remaining portion of semiconductor-containing layer to provide an etch mask having openings with a width ranging from 5 nm to 100 nm;

transferring a pattern provided by the etch mask into the underlying substrate to provide a fin structure having a width ranging from 10 nm to 50 nm;

forming a gate structure on a first portion of the fin structure; and forming a source region and a drain region within the fin structure on opposing sides of the first portion of the fin structure to form a finFET device.

17. The method of claim 16, wherein the semiconductor-containing layer is composed of amorphous Si or polycrystalline Si.

18. The method of claim 16, wherein the substrate comprises a semiconductor layer positioned on a buried insulator layer.

19. The method of claim 16, wherein the angled ion implantation includes an angle ranging from 3° to 75°, wherein the angle is measured at an intersection between a plane parallel to a direction of travel of the dopants and a plane perpendicular to a surface of the substrate.

20. The method of claim 16, wherein the dopants are composed of arsenic, phosphorus, germanium, xenon, argon, krypton, or a combination thereof.

21. The method of claim 16, wherein forming the mask comprises depositing a layer of photoresist atop the semiconductor-containing layer, patterning the photoresist, and developing the photoresist.

22. The method of claim 21, further comprising trimming the mask composed of the photoresist.

23. The method of claim 22, wherein the trimming the mask comprises an isotropic reactive ion etch (RIE) including $O_2$/HBr/Ar plasma chemistry.

24. The method of claim 16, wherein the transferring of the pattern provided by the etch mask into the substrate comprises an anisotropic etch.

* * * * *